(12) United States Patent
Phan et al.

(10) Patent No.: US 11,698,408 B2
(45) Date of Patent: Jul. 11, 2023

(54) TESTING APPARATUS FOR DATA STORAGE DEVICES

(71) Applicant: Western Digital Technologies, Inc., San Jose, CA (US)

(72) Inventors: Ba Duong Phan, Nonth Tustin, CA (US); Alireza Daneshgar, Irvine, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 90 days.

(21) Appl. No.: 17/458,045

(22) Filed: Aug. 26, 2021

(65) Prior Publication Data
US 2023/0060313 A1 Mar. 2, 2023

(51) Int. Cl.
*G01R 31/28* (2006.01)
(52) U.S. Cl.
CPC ..... *G01R 31/2844* (2013.01); *G01R 31/2868* (2013.01); *G01R 31/2889* (2013.01)
(58) Field of Classification Search
CPC .............. G01R 1/0458; G01R 31/2863; G01R 31/2891; G01R 31/2875; G01R 31/2877; G01R 31/2887; G01R 31/2893; G01R 1/045; G01R 31/2862; G01R 31/2868; G01R 31/2896; G01R 31/2844; G01R 31/2889; G01R 1/04; G01R 1/44; G01R 31/287; G01R 31/2874; G01R 31/2884;
(Continued)

(56) References Cited

U.S. PATENT DOCUMENTS

| 7,343,775 B2 | 3/2008 | Cunningham et al. |
| 7,873,885 B1 | 1/2011 | Shin et al. |

(Continued)

FOREIGN PATENT DOCUMENTS

| CN | 212255570 U | 12/2020 |
| JP | 2006308368 A | 11/2006 |

(Continued)

OTHER PUBLICATIONS

International Search Report and Written Opinion dated Sep. 27, 2022 from International Application No. PCT/US2022/030626, 10 pages.

(Continued)

*Primary Examiner* — Vinh P Nguyen
(74) *Attorney, Agent, or Firm* — Barry IP Law, P.C.

(57) ABSTRACT

A testing apparatus for Data Storage Devices (DSDs) includes a chassis and at least one interface module configured to be removably inserted into the chassis and house a plurality of interface boards. Each interface board includes a DSD connector for connecting a DSD to the interface board and a backplane connector for connecting to a backplane for communicating with a respective computing unit. In one aspect, the at least one interface module includes a housing and a plurality of openings in a side of the housing with each opening configured to receive a respective interface board. A plurality of guide member pairs is positioned to guide respective interface boards when inserted into respective openings such that the backplane connector is located at a respective predetermined location for connecting to the backplane. In another aspect, the interface boards are removable from the interface module.

20 Claims, 9 Drawing Sheets

(58) Field of Classification Search
CPC ......... H01L 2225/06589; H01L 21/768; H01L 21/743; G01N 2035/00801; G01N 2035/0465; G01N 35/00732; G01N 35/04; G05B 23/0208; G11C 11/5642; G11C 29/56016; G11C 5/06; G11C 11/5628

See application file for complete search history.

(56) References Cited

U.S. PATENT DOCUMENTS

| | | |
|---|---|---|
| 7,920,380 B2 | 4/2011 | Merrow et al. |
| 8,451,608 B2 | 5/2013 | Merrow |
| 9,163,844 B2 | 10/2015 | Tangney |
| 9,310,427 B2 * | 4/2016 | Kushnick ............ G01R 31/2863 |
| 9,429,623 B2 | 8/2016 | Filler et al. |
| 9,715,896 B2 | 7/2017 | Rancour et al. |
| 9,894,807 B2 | 2/2018 | Bard et al. |
| 10,146,279 B2 | 12/2018 | Vyshetsky |
| 10,631,432 B2 | 4/2020 | Gopalakrishna et al. |
| 2002/0149911 A1 | 10/2002 | Bishop et al. |
| 2007/0034368 A1 | 2/2007 | Atkins et al. |
| 2008/0239649 A1 | 10/2008 | Bradicich et al. |
| 2009/0082907 A1 | 3/2009 | Stuvel et al. |
| 2013/0047650 A1 | 2/2013 | Moss |
| 2014/0077829 A1 | 3/2014 | Oh et al. |
| 2014/0236526 A1 * | 8/2014 | Frediani ............. G01R 31/2834 702/119 |
| 2014/0290023 A1 | 10/2014 | Kay |
| 2015/0294735 A1 | 10/2015 | Gao et al. |
| 2016/0139198 A1 | 5/2016 | Park et al. |
| 2018/0313890 A1 | 11/2018 | Wolff |
| 2019/0277907 A1 * | 9/2019 | Wolff ................ G01R 31/2868 |
| 2020/0200819 A1 | 6/2020 | Malisic et al. |

FOREIGN PATENT DOCUMENTS

| | | |
|---|---|---|
| JP | 2007333559 A | 12/2007 |
| JP | 2011252717 A | 12/2011 |
| JP | 2015087204 A | 5/2015 |
| JP | 2016156798 A | 9/2016 |

OTHER PUBLICATIONS

Go Semi & Beyond; "Q&A Interview with Scott West—Expanding SSD Test Capabilities for Extreme Temperatures" Dec. 16, 2019; available at: https://www.gosemiandbeyond.com/qa-interview-with-scott-west-expanding-ssd-test-capabilities-for-extreme-temperatures/.

Wan et al.; "Air Flow Measurement and Management for Improving Cooling and Energy Efficiency in Raised-Floor Data Centers: A Survey"; IEEE Xplore; Aug. 30, 2018; 35 pages; available at https://ieeexplore.ieee.org/document/8451865.

Scott West; Global Technology, Innovation and Research Group; Advantest America; "Applying Flexible ATE Technology to Protocol Test and the SSDMarket"; Go Semi & Beyond; Nov. 9, 2016; available at https://www.gosemiandbeyond.com/applying-flexible-ate-technology-to-protocol-test-and-the-ssd-market/.

Pending U.S. Appl. No. 17/412,889, filed Aug. 26, 2021, entitled "Testing Apparatus for Temperature Testing of Electronic Devices", Ba Duong Phan.

International Search Report and Written Opinion dated Oct. 27, 2022 from International Application No. PCT/US2022/030623, 11 pages.

* cited by examiner

TESTING APPARATUS FOR DATA STORAGE DEVICES

CROSS-REFERENCE TO RELATED APPLICATION

This application is related to U.S. application Ser. No. 17/412,889 titled "TESTING APPARATUS FOR TEMPERATURE TESTING OF ELECTRONIC DEVICES", filed on Aug. 26, 2021, which is hereby incorporated by reference in its entirety.

BACKGROUND

Manufacturers of Data Storage Devices (DSDs), such as Solid State Drives (SSDs), often test the DSDs before leaving the factory to ensure quality control in terms of data retention or operating performance, for example. In some cases, many DSDs may be simultaneously tested inside a testing apparatus. However, there are many different form factors of SSDs, such as U.2 15 mm, U.2 7 mm, E3, M.2, and EDSFF, which each have different physical sizes and different connectors for the different types of DSDs. Testing for these different form factors typically requires dismantling the testing apparatus and replacing components such as a new backplane to accommodate the different form factors, or using dedicated testing apparatuses for each form factor. Even in cases where a dedicated testing apparatus is used for a particular form factor, accessing the DSDs to replace them with other DSDs to be tested can be difficult. In addition, backplanes that use a Peripheral Component Interconnect express (PCIe) bus can suffer in terms of data errors from having wire runs, which are often used in temperature controlled testing apparatuses to thermally isolate the DSDs from the backplane and testing computers connected to the DSDs.

BRIEF DESCRIPTION OF THE DRAWINGS

The features and advantages of the embodiments of the present disclosure will become more apparent from the detailed description set forth below when taken in conjunction with the drawings. The drawings and the associated descriptions are provided to illustrate embodiments of the disclosure and not to limit the scope of what is claimed.

DETAILED DESCRIPTION

In the following detailed description, numerous specific details are set forth to provide a full understanding of the present disclosure. It will be apparent, however, to one of ordinary skill in the art that the various embodiments disclosed may be practiced without some of these specific details. In other instances, well-known structures and techniques have not been shown in detail to avoid unnecessarily obscuring the various embodiments.

Figure 1:
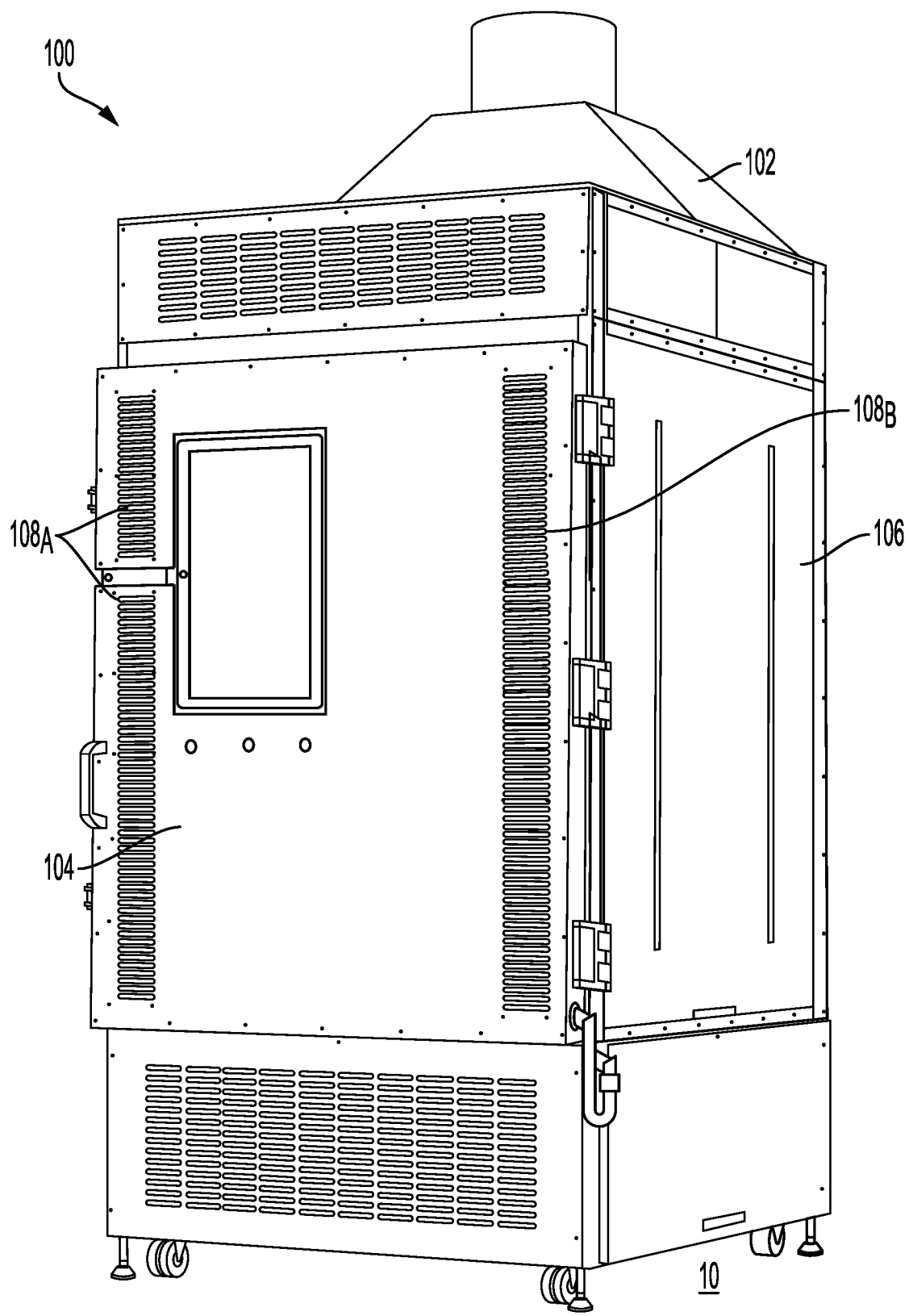
FIG. 1 is a front perspective view of an exterior of a testing apparatus according to one or more embodiments.

FIG. 1 is a front perspective view of an exterior of testing apparatus 100 according to one or more embodiments. Testing apparatus 100 is used to test Data Storage Devices (DSDs), which may also be referred to herein as Devices Under Test (DUTs). In some implementations, testing apparatus 100 can be used, for example, to test DSDs, such as Solid State Drives (SSDs). The testing can be performed by, for example, a manufacturer as part of a quality control process or to test performance capabilities of the DSDs at different temperatures, such as data retention or to determine safe temperature operating limits. Such temperature controlled testing is described in further detail in application Ser. No. 17/412,889, which is incorporated by reference above.

As shown in FIG. 1, testing apparatus 100 rests on surface 10, which may be a floor or other substantially horizontal surface (e.g., within 5 degrees of a ground plane) for supporting testing apparatus 100. As used herein, horizontal or substantially horizontal can refer to a plane that is parallel or substantially parallel (e.g., within 5 degrees) to a surface upon which testing apparatus 100 rests (i.e., surface 10). Testing apparatus 100 includes door 104 that provides access to an interior chamber or space (e.g., chamber 140 in FIG. 2) within chassis 106 that can receive the DSDs to be tested. Door 104 includes intake vents $108_A$ and $108_B$ for drawing in a fluid, such as air, from an exterior of testing apparatus 100 to cool the DSDs inside testing apparatus 100.

In the example of FIG. 1, testing apparatus 100 includes exhaust hood 102 for exhausting fluid from testing apparatus 100. In some implementations, the amount of fluid exhausted from testing apparatus 100 is controlled to adjust the relative amounts of fluid drawn into the chamber and recirculated or recycled within the chamber to reach or maintain a target temperature in the chamber. In other implementations, exhaust hood 102 may be omitted, such as by exhausting the fluid from testing apparatus 100 to an ambient exterior of testing apparatus 100, as opposed to directing the exhausted fluid to a vent.

As will be appreciated by those of ordinary skill in the art with reference to the present disclosure, other implementations of testing apparatus 100 can include a different arrangement or number of components than shown in the example of FIG. 1. For example, other implementations may include a different number of intake vents 108 or a different footprint of testing apparatus 100, such that testing apparatus 100 may be a bench-mounted testing apparatus.

Figure 2:
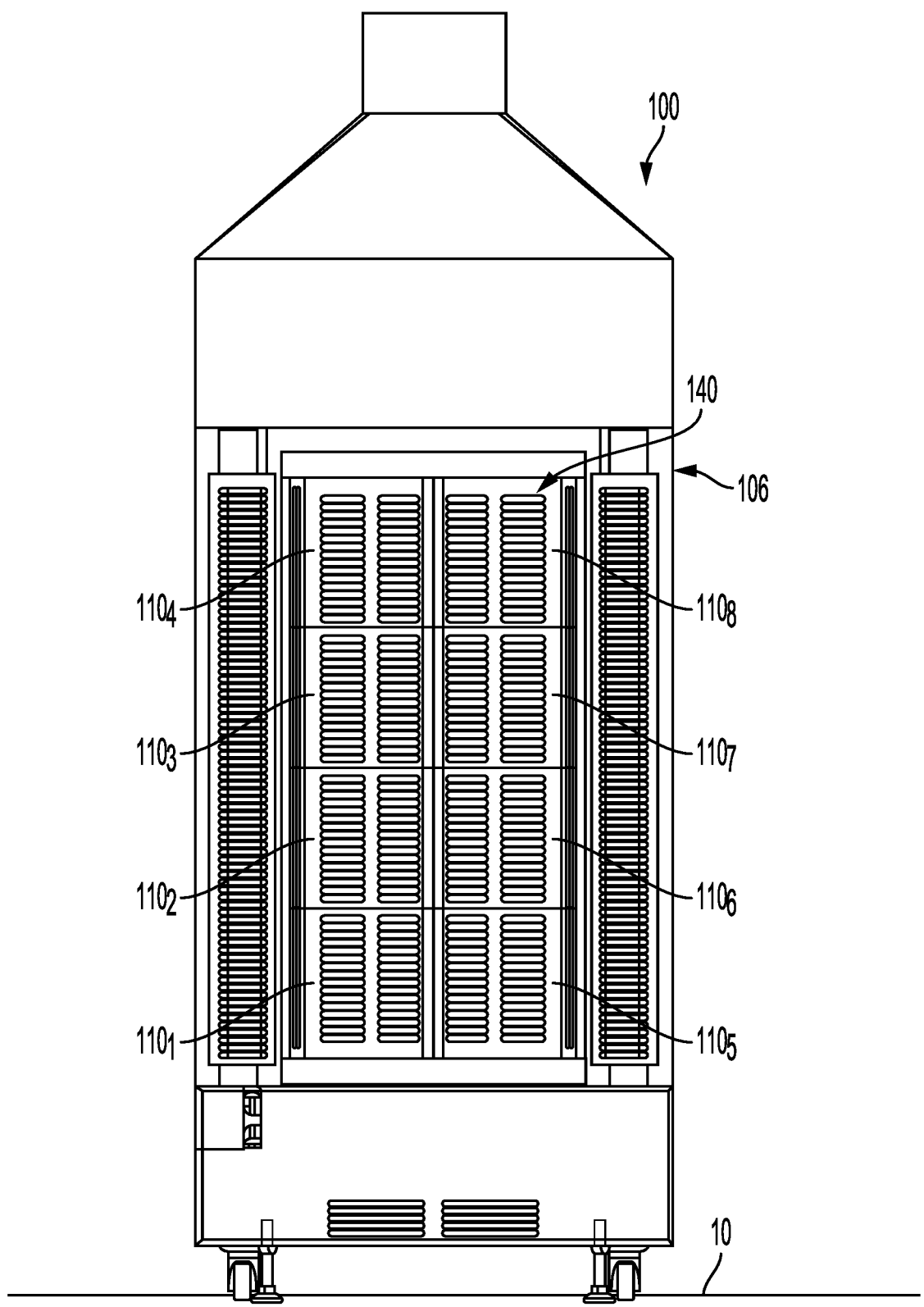
FIG. 2 is a front view of the testing apparatus of FIG. 1 with certain interior components exposed according to one or more embodiments.

FIG. 2 is a front view of the testing apparatus of FIG. 1 with door 104 removed to show certain interior components according to one or more embodiments. As shown in FIG. 2, interface modules $110_1$, $110_2$, $110_3$, $110_4$, $110_5$, $110_6$, $110_7$, and $110_8$ are located inside chamber 140 within chassis 106 of testing apparatus 100. Each interface module 110 in the example of FIG. 2 houses sixteen DSDs, which may be removed and inserted into openings in the front of the interface module 110. The DSDs are arranged in horizontal or substantially horizontal rows with respect to surface 10. Each horizontal row in an interface module 110 includes two DSDs. In addition, each interface module 110 houses interface boards (e.g., interface boards 122 in FIGS. 4, 5, and 7) that are in line with the openings that receive the DSDs. The interface modules 110 themselves, with or without the DSDs and interface boards, may be removed and inserted into chamber 140 into any one of the eight different locations shown in chamber 140.

Those of ordinary skill in the art will appreciate that other implementations may include a different arrangement for the interior of testing apparatus 100. For example, other implementations may include a different number of interface modules or a different number of DSDs per interface module than shown in FIG. 2.

Figure 3:
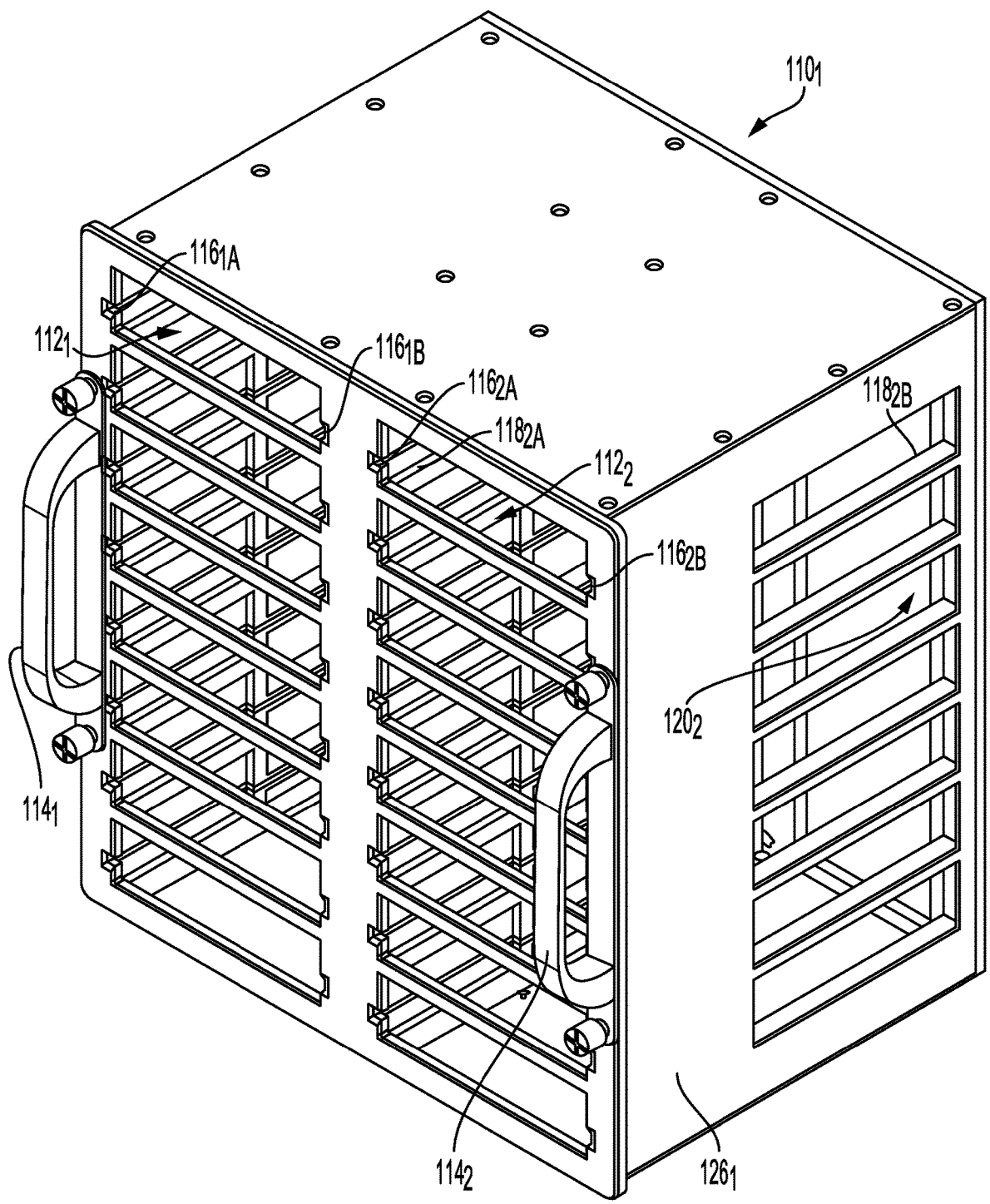
FIG. 3 is a front perspective view of an interface module according to one or more embodiments.

FIG. 3 is a front perspective view of an empty interface module without any DSDs or interface boards according to one or more embodiments. As shown in FIG. 3, interface module $110_1$ includes sixteen openings, such as openings $112_1$ and $112_2$, in a front side of interface module $110_1$. The openings $112_1$ and $112_2$ are arranged in a top horizontal or substantially horizontal row. Each opening in the front side of interface module $110_1$ can receive an interface board and a DSD. Notches $116_{1A}$ and $116_{1B}$ provide a support for holding or securing a DSD in place in opening $112_1$. Notches $116_{2A}$ and $116_{2B}$ provide a support for holding or securing a DSD in place in opening $112_2$. The notches 116 may work in conjunction with locking tabs or another locking mechanism that may form part of an interface board, such as locking tabs 124 shown in FIG. 5. Other implementations may use different locking mechanisms, such as a locking clip or rotating lock, for example.

Each opening also corresponds to a pair of guide members, such as guide members $118_{2A}$ and $118_{2B}$, positioned to guide an interface board inserted through the opening so that a backplane connector (e.g., backplane connectors 123 in FIG. 5) of the interface board is located at a predetermined location with respect to chassis 106 of testing apparatus 100 and with respect to housing $126_1$ of interface module $110_1$ for connecting to a backplane (e.g., backplane 136 in FIGS. 8A and 8B). In the example of FIG. 3, the backplane connectors are configured to protrude from a rear opening, such as rear opening $120_2$, for connection to the backplane.

Handles $114_1$ and $114_2$ can facilitate insertion and removal of interface module $110_1$ into and from the testing apparatus. In this regard, the first space or chamber of the testing apparatus can include shelves or slats for receiving interface module $110_1$ and holding it in place inside chamber 140. The interface modules 110 may also be interchangeable among different testing apparatuses, such as testing apparatus 100. In the implementation of FIG. 3, handles 114 are removable, but other implementations may include non-removable handles or a different number of handles.

Those of ordinary skill in the art will appreciate that other implementations of interface module $110_1$ may differ. For example, interface module $110_1$ may include a mix of different sized openings for receiving DSDs with different form factors, differently sized openings on the rear of interface module $110_1$, or no openings on the sides of interface module $110_1$.

Figure 4:
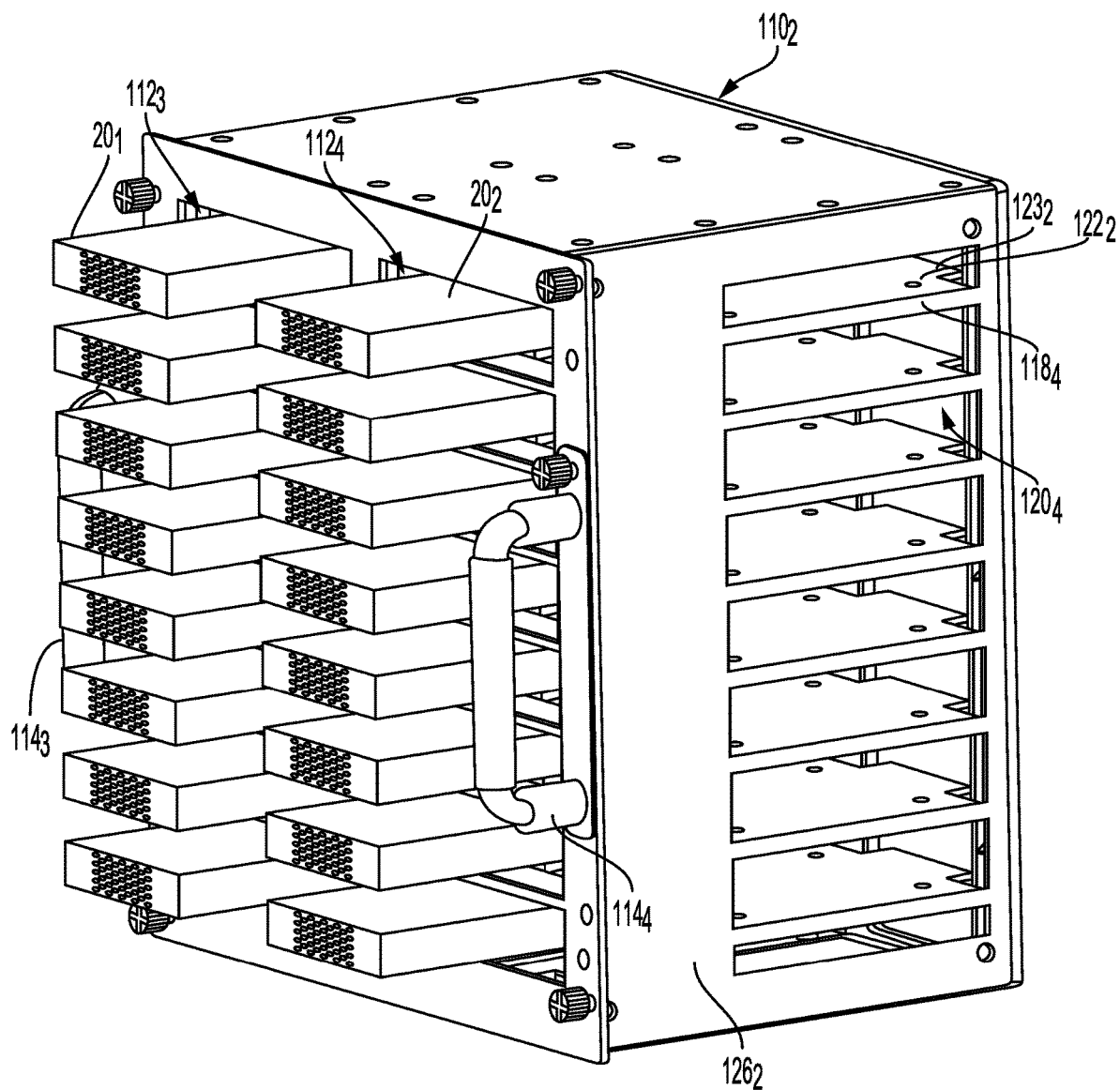
FIG. 4 is a front perspective view of an interface module housing Data Storage Devices (DSDs) and interface boards according to one or more embodiments.

FIG. 4 is a front perspective view of interface module $110_2$ housing DSDs and interface boards inside of housing $126_2$ according to one or more embodiments. As shown in FIG. 2, interface module $110_2$ includes eight horizontal or substantially horizontal rows of DSDs, such as DSD $20_1$ and $20_2$, which have been inserted into openings $112_3$ and $112_4$, respectively, to be partially housed in a respective bay of interface module $110_2$. Each DSD connects to an interface board via a DSD connector of the interface board (not shown). In the example of DSD $20_2$, interface board $122_2$ removably connects to DSD $20_2$, and backplane connector $123_2$ of interface board $122_2$ is accessible via opening $120_4$ in a rear side of interface module $110_2$ opposite front openings 112.

As with interface module $110_1$ discussed above, the interface boards and DSDs shown in FIG. 4 are removable from interface module $110_2$. In this regard, the interface boards are supported and guided into a predetermined position using pairs of guide members on opposite sides of each opening. Guide member $118_4$ is shown in FIG. 4 and is used to support and guide interface board $122_2$.

In the example of FIG. 4, interface module $110_2$ and the interface boards are configured so that each interface board can be inserted into any one of the front openings. Similarly, each DSD in the example of FIG. 4 can be partially inserted into any one of the front openings to connect with any one of the interface boards previously inserted into interface module $110_2$. This interchangeability of DSDs can reduce the testing time for a large number of DSDs in the testing apparatus since the DSDs can be conveniently inserted into the front openings of the testing apparatus and removed when testing is finished, before replacing the DSD with a new DSD to be tested. In some cases, the entire interface module $110_2$ may be swapped out with a different interface module that may already include interface boards and/or DSDs to be tested. In this regard, handles $114_3$ and $114_4$ may be used to remove or insert interface module $110_2$ from or into the testing apparatus chamber.

As discussed in more detail below, interface module $110_2$ may also be capable of accommodating a variety of different form factors with the replacement of the interface boards in housing $126_2$. In some implementations, the front openings may be different sizes to accommodate different form factors or may all be the same size as shown in FIG. 4, which may also be able to accommodate different form factors. Those of ordinary skill in the art will appreciate that interface module $110_2$, the DSDs and interface boards may have a different arrangement or configuration than shown in FIG. 4. For example, other implementations may not include openings on the side of interface module $110_2$ or may include a different number of front openings.

Figure 5:
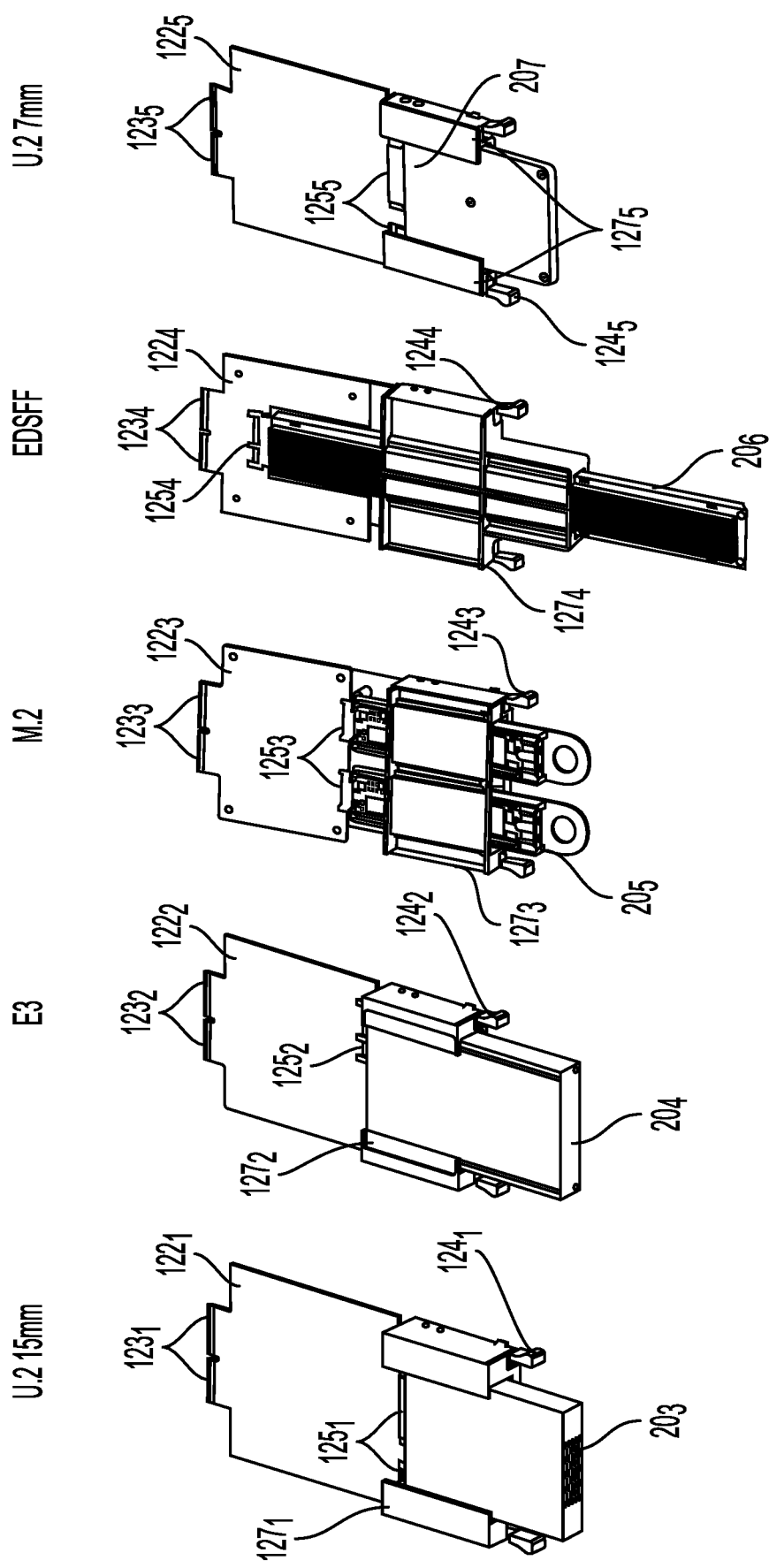
FIG. 5 depicts interface boards connected to DSDs having different form factors according to one or more embodiments.

FIG. 5 depicts interface boards connected to DSDs having different form factors according to one or more embodiments. Each DSD in FIG. 5 has a different form factor and a different corresponding interface board. DSD $20_3$ has a U.2 15 mm form factor, DSD $20_4$ has an E3 form factor, DSD $20_5$ has an M.2 form factor, DSD $20_6$ has an EDSFF form factor, and DSD $20_7$ has a U.2 7 mm form factor. As will be appreciated by those of ordinary skill with reference to the present disclosure, other form factors and corresponding interface boards may be used than those shown in FIG. 5.

In addition to having different physical dimensions, each DSD in FIG. 5 uses a different type of connection to its respective interface board. In this regard, interface board $122_1$ for DSD $20_3$ uses DSD connector $125_1$, interface board $122_2$ for DSD $20_4$ uses DSD connector $125_2$, interface board $122_3$ for DSD $20_5$ uses DSD connector $125_3$, interface board $122_4$ for DSD $20_6$ uses DSD connector $125_4$, and interface board $122_5$ for DSD $20_7$ uses DSD connector $125_5$.

Backplane connectors $123_1$, $123_2$, $123_3$, $123_4$, and $123_5$ of interface boards $122_1$, $122_2$, $122_3$, $122_4$, and $122_5$, respectively, utilize the same Peripheral Component Interconnect express (PCIe) connectors for a uniform backplane connection. This standardization on one backplane connector type, such as PCIe, can facilitate the interchangeability of the different types of interface boards into different slots or bays of the interface modules. In addition to having different DSD connector types, the interface boards 122 in FIG. 5 also have different physical shapes to accommodate the differently sized types of DSDs.

Each interface board 122 in FIG. 5 also includes a DSD support with a locking mechanism to stabilize or hold the DSD in an opening of an interface module. In the example of FIG. 5, DSD supports $127_1$, $127_2$, $127_3$, $127_4$, and $127_5$ hold DSDs $20_3$, $20_4$, $20_5$, $20_6$, and $20_7$ in place in openings, such as openings $112_1$ and $112_2$ in FIG. 3 and openings $112_3$ and $112_4$ in FIG. 4. In addition, locking tabs $124_1$, $124_2$, $124_3$, $124_4$, and $124_5$ can lock or secure DSDs $20_3$, $20_4$, $20_5$, $20_6$, and $20_7$ into their respective openings. The pairs of locking tabs 124 for each DSD can lock into notches, such as notches 116 of interface module $110_1$ in FIG. 3, to secure the DSDs into the openings.

Those of ordinary skill in the art will appreciate that other locking mechanisms or interface boards may be used in other implementations. For example, other interface boards may have a different shape or DSD support to accommodate a different form factor.

Figure 6:
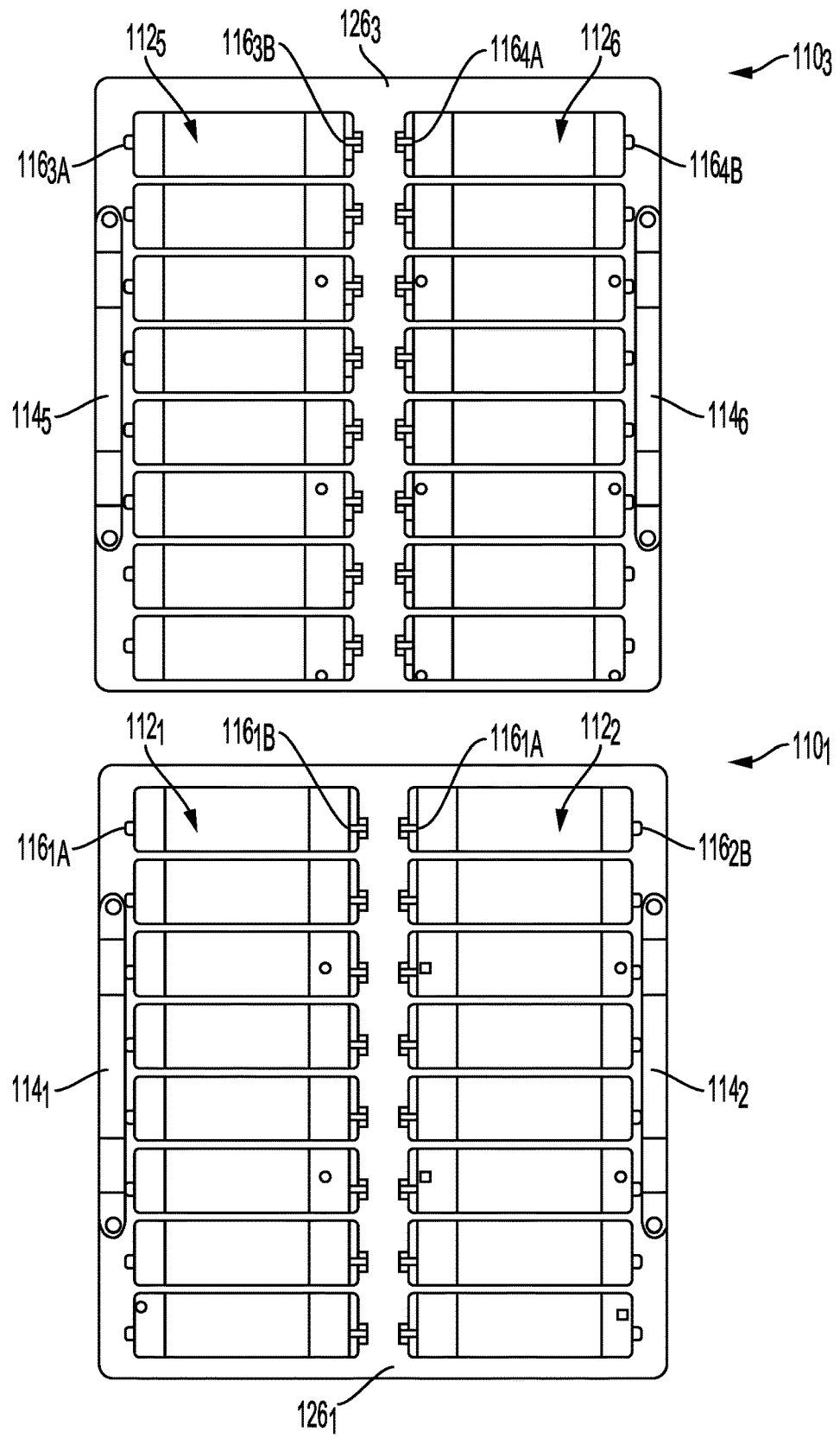
FIG. 6 depicts front views of interface modules used for DSDs having different form factors according to one or more embodiments.

FIG. 6 depicts front views of interface modules used for DSDs having different form factors according to one or more embodiments. As shown in FIG. 6, interface modules $110_3$ and $110_1$ include front openings in housings $126_3$ and $126_1$, respectively. Openings $112_5$ and $112_6$ in interface module $110_3$ and openings $112_1$ and $112_2$ in interface module $110_1$ have slightly different sizes to accommodate different form factors or types of DSDs. In addition, the relative locations of the notches with respect to the front openings in interface module $110_3$, such as notches $116_{3A}$, $116_{3B}$, $116_{4A}$, and $116_{4B}$, differs from the relative locations of the notches with respect to the front openings in interface module $110_1$, such as notches $116_{1A}$, $116_{1B}$, $116_{2A}$, and $116_{2B}$. The locations of guide members within interface modules $110_3$ and $110_1$ (e.g., guide member $118_{2B}$) may also differ to accommodate DSDs having different form factors, such as by being located more towards a halfway height of the front openings, as opposed to being located below a halfway height, as with the case of the notches in interface module $110_1$. As with handles $114_1$ and $114_2$ of interface module $110_1$, handles $114_5$ and $114_6$ facilitate insertion and removal of interface module $110_3$ into and from a testing apparatus.

Figure 7:
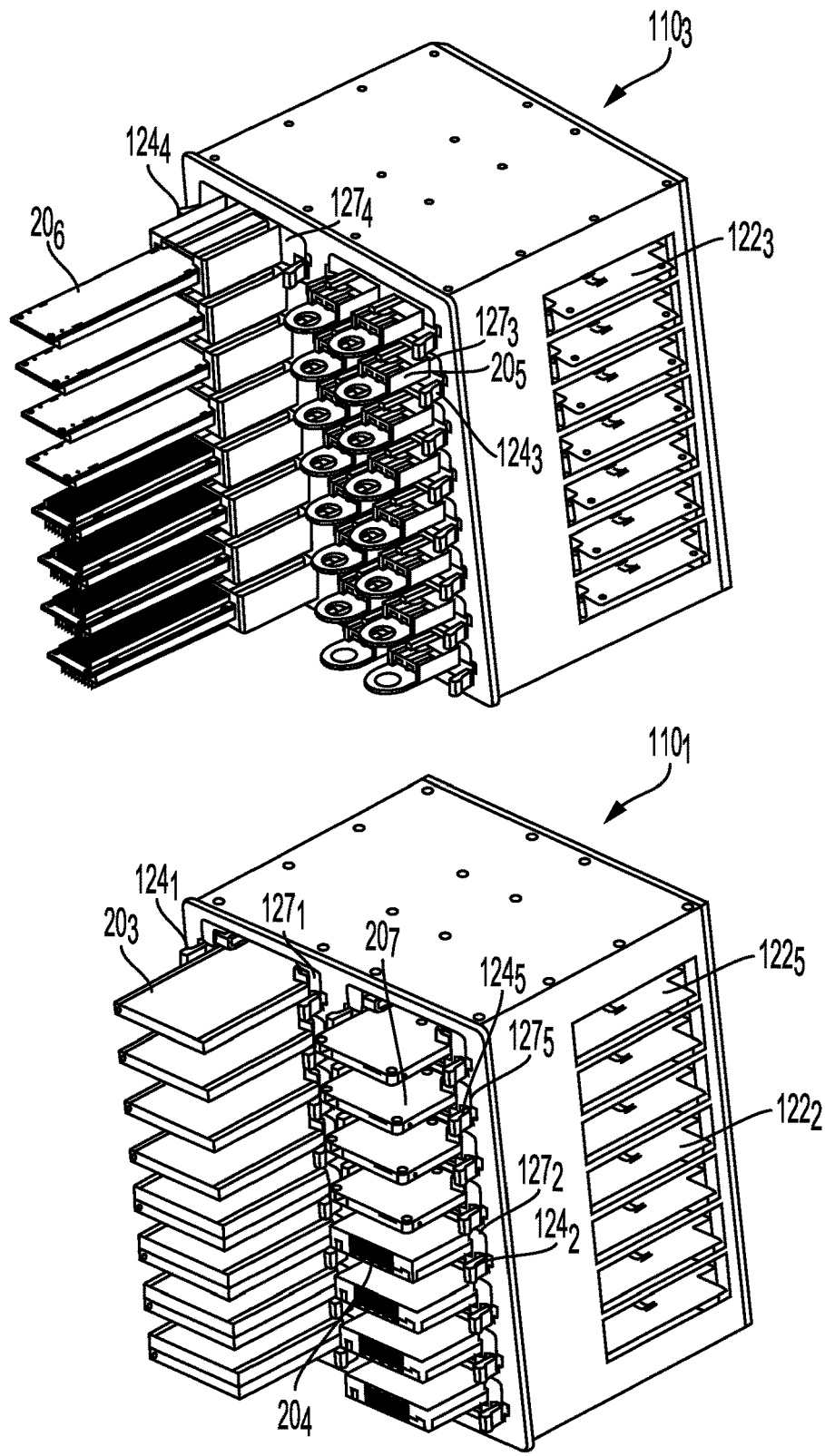
FIG. 7 is a front perspective view of the interface modules of FIG. 6 when housing DSDs and interface boards according to one or more embodiments.

FIG. 7 is a front perspective view of the interface modules of FIG. 6 when housing DSDs and interface boards according to one or more embodiments. As shown in FIG. 7, interface module $110_3$ houses three different types of DSDs having different form factors and interface module $110_1$ houses four different types of DSDs having different form factors. In this regard, interface module $110_3$ can house both DSD $20_6$ and DSD $20_5$ due in part to the different interface boards, such as interface board $122_3$. In the example of FIG. 7, DSD $20_6$ is held in place in interface module $110_3$ with the use of DSD support $127_4$ and locking tabs $124_4$ of interface board $122_4$ shown in FIG. 5. Similarly, DSD $20_5$ is held in place in interface module $110_3$ with the use of DSD support $127_3$ and locking tabs $124_3$ of interface board $122_3$.

With respect to interface module $110_1$, DSD $20_3$ is secured into interface module $110_1$ with DSD support $127_1$ and locking tabs $124_1$. DSD $20_4$ is secured into interface module $110_1$ with DSD support $127_1$ and locking tabs $124_1$, and DSD $20_4$ is secured into interface module $110_1$ with DSD support $127_2$ and locking tabs $124_2$. As shown in FIG. 7, interface boards $122_5$ and $122_2$ are used to connect communications with DSDs $20_7$ and $20_4$, respectively. The interchangeability of DSDs having different form factors and corresponding interface boards that can be used with an interface module can allow for the simultaneous testing of DSDs having different form factors. The only changes needed to switch from one form factor to another for a given opening in the interface module is to change the interface board. This arrangement allows for more flexibility in the equipment used for testing DSDs.

Figure 8:
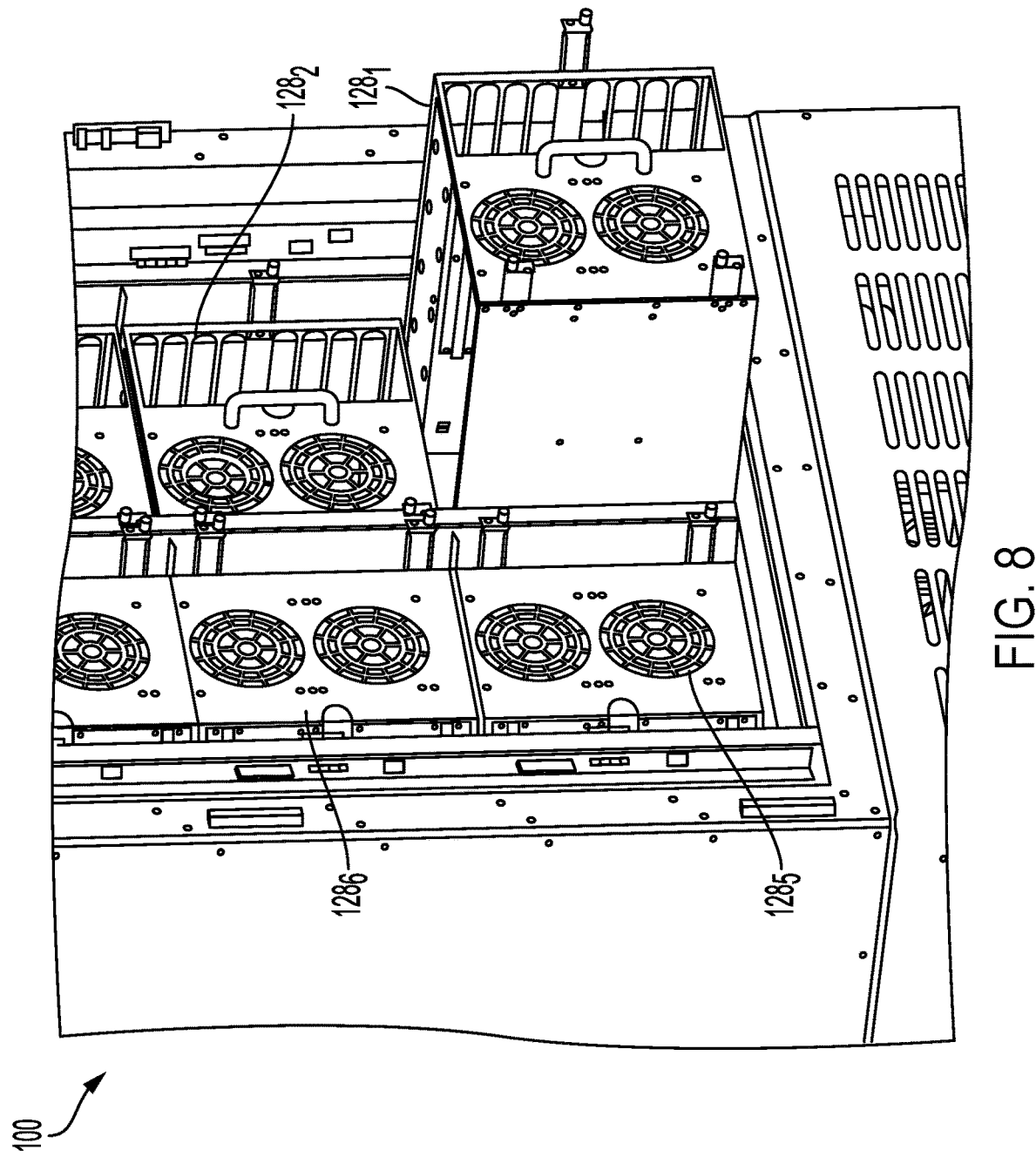
FIG. 8 is a rear perspective of a testing apparatus depicting a removable computing module before complete insertion into or complete removal from the testing apparatus according to one or more embodiments.

FIG. 8 is a rear perspective of testing apparatus 100 depicting removable computing module $128_1$ before complete insertion into or complete removal from testing apparatus 100 according to one or more embodiments. As shown in FIG. 8, removable computing module $128_1$ is part of a rear portion or rear space of testing apparatus 100 that is located behind the testing chamber or front space that houses interface modules. For its part, removable computing module $128_1$ houses one or more computing units, which may include, for example, processing circuitry, such as one or more Central Processing Units (CPUs), Field-Programmable Gate Arrays (FPGAs), Application-Specific Integrated Circuits (ASICs), or Graphics Processing Units (GPUs), that have been programmed to run tests on DSDs in a testing chamber of the testing apparatus.

In the example of FIG. 8, removable computing unit $128_1$ corresponds to an interface module in chamber 140 accessed via door 104 from the front of testing apparatus 100. Removable computing unit $128_1$ may abut a corresponding interface module or be on an opposite side of a wall between the corresponding interface module and the removable computing unit $128_1$ to allow for a direct connection between interface boards inside the corresponding interface module and a backplane of removable computing module $128_1$ (i.e., backplane 136 shown in FIG. 9).

In this regard, each of removable computing modules $128_1$, $128_2$, $128_5$ and $128_6$ shown in FIG. 8 can correspond to a respective interface module in chamber 140 accessed via door 104 from the front of testing apparatus 100. The removable computing modules 128 can be removed from and inserted into any one of the different locations using, for example, guide rails in testing apparatus 100. The removable computing modules 128 may be further secured to testing apparatus 100 in some implementations using screws or other locking mechanisms. The interchangeability of computing modules 128 in testing apparatus 100 can facilitate changes to be made to the computing unit or computing units in the removable computing module 128 before reinserting the computing module 128 into its previous location or before swapping the computing module with a different removable computing module 128.

Figure 9:
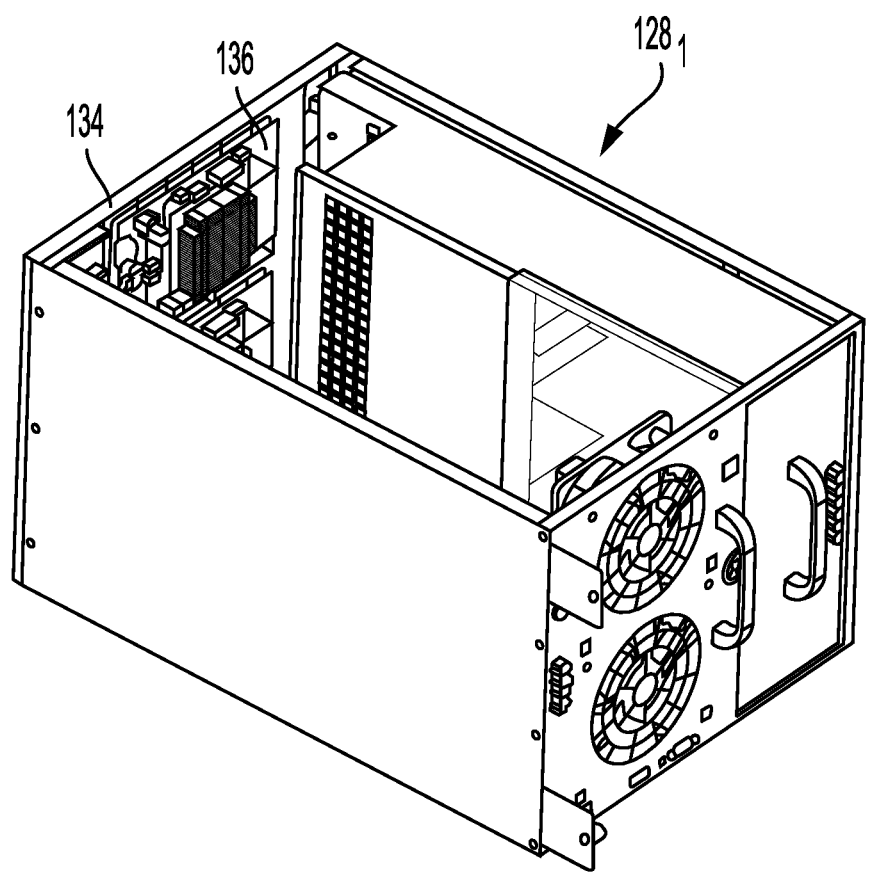
FIG. 9 is a rear perspective of a removable computing module according to one or more embodiments.

FIG. 9 is a rear perspective of removable computing module $128_1$ according to one or more embodiments. As shown in FIG. 9, removable computing module $128_1$ includes backplane 136 and thermal isolation wall 134. The computing unit of removable computing module $128_1$ directly connects to backplane 136, which in turn, directly connects to interface boards inside the corresponding interface module in chamber 140.

In the example of FIG. 9, a computing unit, which may be part of a motherboard, is separated from the testing chamber and its corresponding interface module by thermal isolation wall 134, which provides a thermal barrier between the testing chamber and test engine compartment 128. As discussed in application Ser. No. 17/412,889 incorporated by reference above, the testing chamber may be temperature controlled to run different tests at different temperatures or to ensure operation of the DSDs at a target temperature or at an approximate target temperature.

Backplane 136 allows for a wireless connection to the interface boards in the testing chamber without compromising the thermal isolation provided by thermal isolation wall 134. In contrast, conventional temperature testing apparatuses for DSDs typically use wires with grommets surrounding the wires for communication with DSDs in a temperature-controlled testing chamber. However, bus standards such as PCIe may encounter noise-induced errors due to such wire runs. The arrangement of backplane 136 on thermal isolation wall 134 can provide for direct connections with interface boards, which are in turn directly connected to the DSDs to avoid wire runs while still providing thermal isolation of the testing chamber.

As discussed above, the foregoing arrangements of removable interface modules and removable interface boards can facilitate the testing of DSDs having different form factors using the same testing apparatus. This interchangeability can avoid complicated teardowns of testing equipment to accommodate different form factors. In addition, the interface boards can allow for a wire-free connection to the backplane and computing units, while still thermally isolating the DSDs from the computing units and backplane in a different compartment of the testing apparatus for better temperature control.

Other Embodiments

Those of ordinary skill in the art will appreciate that the various illustrative logical blocks, modules, and processes described in connection with the examples disclosed herein may be implemented as electronic hardware, computer software, or combinations of both. Furthermore, the foregoing processes can be embodied on a computer readable medium which causes processor or controller circuitry to perform or execute certain functions.

To clearly illustrate this interchangeability of hardware and software, various illustrative components, blocks, and modules have been described above generally in terms of their functionality. Whether such functionality is implemented as hardware or software depends upon the particular application and design constraints imposed on the overall system. Those of ordinary skill in the art may implement the described functionality in varying ways for each particular application, but such implementation decisions should not be interpreted as causing a departure from the scope of the present disclosure.

The various illustrative logical blocks, units, modules, processor circuitry, and controller circuitry described in connection with the examples disclosed herein may be implemented or performed with a general purpose processor, a GPU, a Digital Signal Processor (DSP), an ASIC, an FPGA or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. Processor or controller circuitry may also be implemented as a combination of computing devices, e.g., a combination of a DSP and a microprocessor, a plurality of microprocessors, an SoC, one or more microprocessors in conjunction with a DSP core, or any other such configuration.

The activities of a method or process described in connection with the examples disclosed herein may be embodied directly in hardware, in a software module executed by processor or controller circuitry, or in a combination of the two. The steps of the method or algorithm may also be performed in an alternate order from those provided in the examples. A software module may reside in RAM memory, flash memory, ROM memory, EPROM memory, EEPROM memory, registers, hard disk, a removable media, an optical media, or any other form of storage medium known in the art. An exemplary storage medium is coupled to processor or controller circuitry such that the processor or controller circuitry can read information from, and write information to, the storage medium. In the alternative, the storage medium may be integral to processor or controller circuitry. The processor or controller circuitry and the storage medium may reside in an ASIC or an SoC.

The foregoing description of the disclosed example embodiments is provided to enable any person of ordinary skill in the art to make or use the embodiments in the present disclosure. Various modifications to these examples will be readily apparent to those of ordinary skill in the art, and the principles disclosed herein may be applied to other examples without departing from the spirit or scope of the present disclosure. The described embodiments are to be considered in all respects only as illustrative and not restrictive. In addition, the use of language in the form of "at least one of A and B" in the following claims should be understood to mean "only A, only B, or both A and B."

What is claimed is:

1. A testing apparatus for testing Data Storage Devices (DSDs), the testing apparatus comprising:
   a chassis; and
   at least one interface module configured to be removably inserted into the chassis and to house a plurality of interface boards,
   wherein each interface board of the plurality of interface boards includes a DSD connector for connecting a DSD to the interface board and a backplane connector for directly connecting to a backplane for communicating with a respective computing unit.

2. The testing apparatus of claim 1, wherein the at least one interface module includes a plurality of openings for receiving the plurality of interface boards, and
   wherein the plurality of interface boards is removable from the at least one interface module such that each interface board of the plurality of interface boards is configured to be inserted into any one of the plurality of openings of the at least one interface module.

3. The testing apparatus of claim 1, wherein the at least one interface module includes a plurality of openings for receiving the plurality of interface boards and respective DSDs, and
   wherein the plurality of openings includes openings of different sizes for receiving DSDs having different form factors.

4. The testing apparatus of claim 1, wherein the backplane connectors of the plurality of interface boards are of the same type and at least two of the DSD connectors of the plurality of interface boards are of different types from each other.

5. The testing apparatus of claim 1, further comprising a computing module configured to be removably inserted into the chassis and to house a plurality of computing units, wherein each computing unit of the plurality of computing units is configured to connect to the backplane.

6. The testing apparatus of claim 1, wherein the at least one interface module includes a plurality of first openings in a first side, each opening of the plurality of openings configured to receive a respective interface board, and
wherein the plurality of openings is arranged in at least one horizontal row with respect to a surface upon which the testing apparatus rests.

7. The testing apparatus of claim 1, wherein the at least one interface module includes:
a plurality of first openings in a first side, each opening of the plurality of openings configured to receive a respective interface board; and
a plurality of guide member pairs positioned to guide respective interface boards when received in respective first openings of the plurality of first openings such that a backplane connector of the interface board is located at a predetermined location with respect to the chassis for connecting to a backplane.

8. The testing apparatus of claim 1, further comprising a thermal isolation wall separating a first space within the chassis from the backplane, the first space configured to receive the at least one interface module.

9. An interface module of a testing apparatus for testing Data Storage Devices (DSDs), the interface module comprising:
a housing;
a plurality of openings in a first side of the housing, each opening of the plurality of openings configured to receive a respective interface board; and
a plurality of guide member pairs positioned to guide respective interface boards when inserted into respective openings of the plurality of openings such that a backplane connector of each respective interface board is located at a respective predetermined location with respect to the housing for directly connecting to a backplane of the testing apparatus.

10. The interface module of claim 9, wherein the respective interface boards are removable from the plurality of openings such that each of the respective interface boards is configured to be inserted into any one of the plurality of openings.

11. The interface module of claim 9, wherein the plurality of openings are further configured to receive respective DSDs, and
wherein the plurality of openings includes openings of different sizes for receiving DSDs having different form factors.

12. The interface module of claim 9, wherein the respective interface boards further include a DSD connector for communicating with a DSD, and
wherein the backplane connectors of the respective interface boards are of the same type and at least two of the DSD connectors of the respective interface boards are of different types from each other.

13. The interface module of claim 9, wherein the plurality of openings is arranged in at least one horizontal row with respect to a surface upon which the testing apparatus rests.

14. The interface module of claim 9, wherein the at least one interface module is configured to be removably inserted into a chassis of the testing apparatus.

15. The interface module of claim 9, wherein the testing apparatus includes a thermal isolation wall separating the interface module from the backplane.

16. A testing apparatus for testing Data Storage Devices (DSDs), the testing apparatus comprising:
a chassis;
means for housing a plurality of removable interface boards in the chassis, wherein each removable interface board of the plurality of removable interface boards is configured to be removably inserted into the means for housing the plurality of removable interface boards,
wherein each removable interface board of the plurality of removable interface boards includes a DSD connector for connecting to a DSD and a backplane connector for connecting to a backplane for communicating with a respective computing unit; and
a thermal isolation wall separating a first space within the chassis from the backplane, the first space configured to receive the means for housing the plurality of removable interface boards.

17. The testing apparatus of claim 16, wherein the means for housing the plurality of removable interface boards is configured to be removably inserted into the chassis.

18. The testing apparatus of claim 16, wherein the means for housing the plurality of removable interface boards is configured to guide respective removable interface boards such that when the removable interface board is inserted into the means for housing the plurality of removable interface boards, the backplane connector of each respective removable interface board is located at a respective predetermined location with respect to the chassis for connecting to the backplane.

19. The testing apparatus of claim 16, further comprising means for removably inserting a plurality of computing units into the chassis, housing a plurality of computing units, wherein each computing unit of the plurality of computing units is configured to connect to the backplane.

20. The testing apparatus of claim 16, wherein the backplane connector of each removable interface board of the plurality of removable interface boards is configured to directly connect to the backplane.

* * * * *